(12) United States Patent
Kotov et al.

(10) Patent No.: US 7,263,005 B2
(45) Date of Patent: Aug. 28, 2007

(54) METHOD OF PROGRAMMING A NON-VOLATILE MEMORY CELL BY CONTROLLING THE CHANNEL CURRENT DURING THE RISE PERIOD

(75) Inventors: Alexander Kotov, Sunnyvale, CA (US); Yuniarto Widjaja, San Jose, CA (US); Tho Ngoc Dang, San Jose, CA (US); Hung Q. Nguyen, Fremont, CA (US); Sang Thanh Nguyen, Union City, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 11/487,135

(22) Filed: Jul. 14, 2006

(65) Prior Publication Data

US 2006/0285394 A1 Dec. 21, 2006

Related U.S. Application Data

(62) Division of application No. 10/944,584, filed on Sep. 16, 2004, now Pat. No. 7,102,930.

(60) Provisional application No. 60/511,188, filed on Oct. 14, 2003.

(51) Int. Cl.
*G11C 16/04* (2006.01)

(52) U.S. Cl. ............................ 365/185.28; 365/185.18; 365/185.19

(58) Field of Classification Search ........... 365/185.18, 365/185.19, 185.28
See application file for complete search history.

(56) References Cited

U.S. PATENT DOCUMENTS

| 4,434,478 | A | * | 2/1984 | Cook et al. | ............ 365/185.18 |
| 5,029,130 | A | | 7/1991 | Yeh | |
| 6,040,598 | A | * | 3/2000 | Nakayama et al. | ......... 257/329 |
| 6,091,636 | A | * | 7/2000 | Liu et al. | ............... 365/185.19 |
| 6,172,908 | B1 | * | 1/2001 | Cappelletti et al. | .... 365/185.19 |

\* cited by examiner

*Primary Examiner*—Lý Duy Pham
(74) *Attorney, Agent, or Firm*—DLA Piper US LLP

(57) ABSTRACT

A method to eliminate program deceleration and to enhance the resistance to program disturbance of a non-volatile floating gate memory cell is disclosed. This method eliminates or minimizes the impact of the hole displacement current. This can be done, for example, by increasing the rise time of the high programming voltage applied to the high voltage terminal. Alternatively, the transistor of the non-volatile floating gate memory cell can be turned off until the voltage applied to the high voltage terminal has reached the programming voltage. This can be done, for example by delaying the voltage applied to either the low voltage terminal or to the control gate to turn on the transistor until the voltage at the high voltage terminal has past the ramp up voltage and has reached a level programming voltage.

9 Claims, 2 Drawing Sheets

Electron and Hole Currents during Program

METHOD OF PROGRAMMING A NON-VOLATILE MEMORY CELL BY CONTROLLING THE CHANNEL CURRENT DURING THE RISE PERIOD

CROSS-REFERENCE TO RELATED APPLICATIONS

This application is a divisional application of U.S. patent application Ser. No. 10/944,584 filed on Sep. 16, 2004, now U.S. Pat. No. 7,102,930, the subject matter of which is incorporated herein by reference.

This application claims the priority of a provisional application filed on Oct. 14, 2003, Ser. No. 60/511,188, whose disclosure is incorporated herein in its entirety by reference.

TECHNICAL FIELD

The present invention relates to a method for increasing the speed of programming in a non-volatile memory device, having a floating gate for storage, programmed by channel hot electron injection or source side injection, and more particularly wherein the method has enhanced resistance to program disturbance.

BACKGROUND OF THE INVENTION

Non-volatile memory cells using floating gate for storage are well known in the art. Typically, these types of memory cells use a conductive floating gate to store one or more bits, i.e. either the floating gate stores some charges or it does not. The charges stored on a floating gate control the conduction of charges in a channel of a transistor, with the transistor having a "control gate", "source" and a "drain," with the "source" and "drain" in a substrate and a channel region therebetween. Clearly the terms "source" and "drain" may be interchanged. The floating gate controls the conduction of current either in the entire channel region or in a portion thereof. Typically, "programming" is the act of adding electrons to the floating gate, thereby lowering the memory cell read current. Although there are various mechanism to program a floating gate non-volatile memory cell, the present invention is an algorithm to improve the speed of programming of a floating gate non-volatile memory cell which occurs by either the mechanism of hot electron injection from the channel region or by source side injection of electrons from the channel region. During programming, a "high" voltage is applied to one of the terminals of the transistor—hereinafter called the high voltage terminal. Intuitively, one expects programming to be more efficient, i.e. the memory cell read current after programming decreases as the programming voltage is increased. This is termed program acceleration. However, it has been found that at a certain point of the programming voltage, any further increase of the programming voltage would actually cause the memory cell read current after programming to increase. This is termed program deceleration. Between the range at which program acceleration levels off, and when program deceleration starts is a window of ideal programming voltages. This is termed Program Acceleration Deceleration (PAD) Window. As the scale of integration increases, i.e. the geometry for semiconductor processing decreases, the PAD Window narrows. Further, the PAD Window also narrows as temperature increases.

Referring to FIG. 1, it can be seen that for one example of a floating gate non-volatile memory cell, at a certain geometry size, the program acceleration at 20° C. ranges from below 6.5 volts to approximately 7.0 volts. The program deceleration ranges from approximately 8.4 volts and up. Thus the PAD Window is approximately from about 7.0 volts to about 8.4 volts. However, for the same non-volatile memory cell at 100° C., the PAD Window disappears and it narrows at approximately 8.25 volts. This limitation on the range for the PAD Window places a constraint on the accuracy of other electronic circuit components in a non-volatile memory device, such as charge pump and the like.

There are generally two types of non-volatile memory cells: stacked gate or split gate. In a stacked gate floating gate non-volatile memory cell, the floating gate is positioned adjacent to the entire channel region and controls the flow of current in the entire channel region. The control gate is capacitively coupled to the floating gate. In a split gate floating gate non-volatile memory cell, the floating gate is positioned adjacent to a first portion of the channel region and controls the flow of current in that first portion. A control gate is positioned laterally spaced apart from the floating gate and controls a second portion of the channel region. See U.S. Pat. No. 5,029,130 for an example of a split gate floating gate non-volatile memory cell, and array, whose disclosure is incorporated herein by reference in its entirety. The present invention can be used in stacked gate or split gate types of floating gate non-volatile memory cells.

SUMMARY OF THE INVENTION

A floating gate storage transistor has a first region and a second region in a semiconductor substrate with a channel region between the first region and the second region. A floating gate is spaced apart from the channel region and is for controlling the flow of current therein. The floating gate is programmed by either channel hot electron injection or by source side injection. A method of programming the floating gate storage transistor comprises applying a first voltage to the first region, and a second voltage to the second region. The second voltage is of a rise time that reduces displacement current between the second region and the first region.

The present invention is also a method of programming the foregoing described non-volatile storage transistor by applying a first voltage to the first region, wherein the first voltage is characterized by a rise period, a programming period, and a fall period. The flow of channel current from the first region to the second region is turned off during the rise period.

DETAILED DESCRIPTION OF THE INVENTION

The present invention is a method to increase the PAD Window. One example of the present invention is applied to the non-volatile floating gate memory cell of the split gate type shown and described in U.S. Pat. No. 5,029,130, whose disclosure is incorporated by reference in its entirety. However, the present invention is not so limited and may be applied to other non-volatile floating gate memory cells, including stacked gate, so long as programming occurs by source side injection from the channel onto the floating gate or by hot channel electron injection onto the floating gate.

Figure 1:
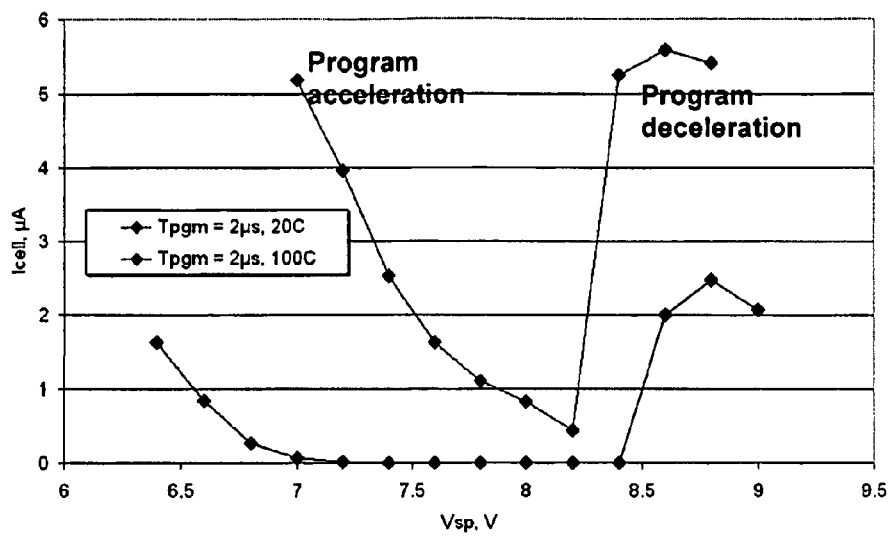
FIG. 1 is a graph showing the Program Acceleration Deceleration (PAD) Window, showing the narrowing of the window as a function of temperature.
Figure 2:
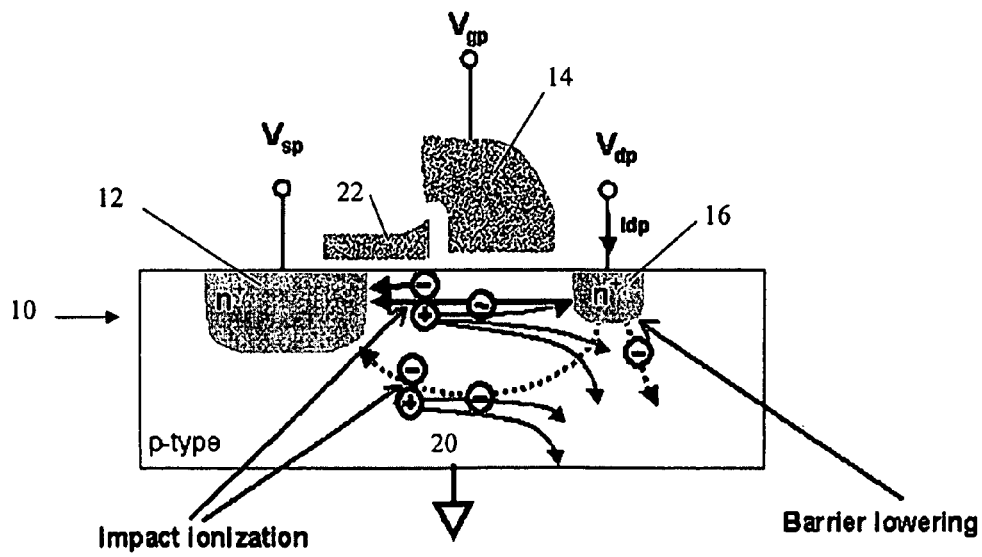
FIG. 2 is a cross sectional view of one example of a floating gate non-volatile memory cell to which the method of the present invention may be applied, showing the generation of the displacement current $I_{dis}$ as the high voltage is applied to the high voltage terminal.

Referring to FIG. 2 there is shown a cross-sectional view of a device 10 of the type shown and described in the aforementioned U.S. patent. The device 10 is made of a semiconductor substrate 20 with a source region 12 and a drain region 16 spaced apart from one another with a channel region therebetween. A floating gate 22 is spaced apart and insulated from a first portion of the channel region, and is capacitively coupled to the source region 12. The floating gate 22 controls the flow of current in the first portion of the channel region. A control gate 14 is insulated and spaced apart from a second portion of the channel region, and is laterally spaced apart from the floating gate 22. The control gate controls the flow of current in the second portion of the channel region. During programming a high voltage, Vsp, is applied to the source 12. During programming a voltage Vgp is applied to the control gate 14, and a voltage Vdp is applied to the drain 16, or the low voltage terminal. Programming of electrons onto the floating gate 22 occurs by either the mechanism of source side injection or channel hot electron injection. It has been discovered that the cause of program deceleration is that during programming, holes are generated near the source 12. The holes drift to the drain 16 or the bit line 16 and the substrate 20 forming a hole displacement current Idis. As is well known to those skilled in the art, the direction of flow of hole current is the direction of flow of "current", whereas the direction of flow of electrons is opposite to the direction of flow of "current". The hole displacement current Idis is generated in accordance with the following equation.

$$I_{dis} \approx C_{SL} \times \partial Vsp/\partial t$$

Thus, as can be seen from the foregoing equation, the displacement current Idis flowing from the source 12 to the drain 16 and substrate 20 is proportional to the rate of change of the voltage Vsp applied to the source 12.

When the hole displacement current Idis is generated, the holes near the bit line 16 or the drain 16 lowers the PN junction barrier between the drain region 16 and the substrate 20. The lower barrier forces the bit line 16 to inject more electrons. However, as the electrons are injected into the substrate 20, they combine with the hole current Idis, and are annihilated. As a result, a portion of the total electron flow from the bit line 16 is used to simply combine with the hole displacement current Idis, and only a portion of the electron flow is used to program the cell. This, slows the programming process.

A further problem with the hole displacement current Idis is that the holes generated may also radiate to a neighboring cell and soft program a neighboring cell causing a program disturbance on the neighboring cell.

Figures 3A, 3B:
FIG. 3a is a timing chart showing the prior art method of applying a ramped up high voltage to the high voltage terminal.
FIG. 3b is a timing chart showing one method of the present invention to reduce the programming efficiency degradation caused by the displacement current from the high voltage terminal.

To reduce or eliminate the programming efficiency degradation caused by the hole displacement current Idis, there are two methods. The first method is shown in FIGS. 3a & 3b. FIG. 3a shows the ramp up rate of the prior art of the voltage Vsp, applied to the source 12, showing that typically, the high voltage for programming is quickly ramped up from Vdd (approximately 3.0 volts) to Vsp and applied to the source line 12 at a rate greater than 4 v/200 ns or 1 v/50 ns. In the first method of the present invention, as shown in FIG. 3b, the ramp up time to apply the programming voltage Vsp to the source 12 is deliberately increased. This can be done, for example, by having a circuit that takes the output of the charge pump, and "deliberately" stretches the ramp up rate. Alternatively, the charge pump can be designed to "stretch" the ramp up rate, so that it is longer than the intrinsic ramp up rate. It has been found that when the ramp up time is 500 ns or longer, from Vdd (approximately 3.0 volts) to Vsp (approximately 9 volts) or at a rate of less than approximately 1 v/80 ns, program deceleration is significantly decreased. When the rise time for the Vsp is increased, the PAD Window is greatly increased. The theoretical basis for increasing the rise time for Vsp is that the displacement current Idis flowing from the source 12 to the drain 16 and substrate 20 is proportional to the rate of change of the voltage Vsp. If the rise time for Vsp is increased, then the rate of change of Vsp would decrease which would decrease the displacement current Idis generated. Of course, the displacement current Idis would also decrease when the fall time or trail time for Vsp to Vdd is also increased. In a preferred embodiment, if the fall time of Vsp to Vdd is increased to approximately 100 ns, or at a rate of less than Iv/20 ns, the displacement current Idis would decrease significantly.

Another benefit of reducing Idis is that when the hole displacement current Idis is generated, it may radiate from the cell being programmed to a neighboring cell inducing a program disturbance or column disturbance on the neighboring cell. Minimizing the hole displacement current Idis to minimize the program deceleration would also minimize the program disturbance.

Figure 4:
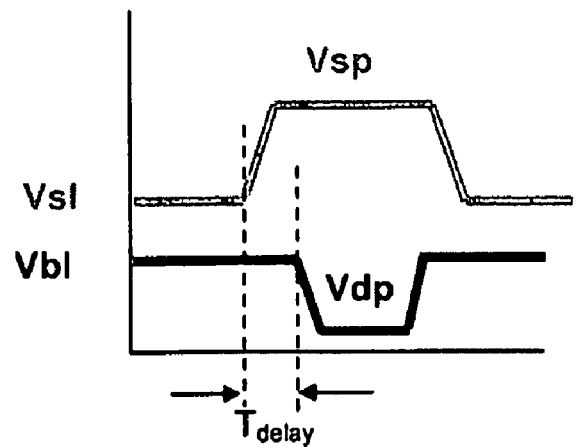
FIG. 4 is a timing diagram of another method of the present invention to reduce the programming efficiency degradation caused by the displacement current from the high voltage terminal.

A second method of reducing the programming efficiency degradation caused by the hole displacement current Idis is to turn off the storage transistor device 10 during the rise time (or the fall time) as the programming voltage is ramped up to Vsp and is applied to the source line 12, or as the programming voltage is decreased from Vsp to Vdd. One way of keeping the transistor 10 turned off during this period is shown in FIG. 4. When the select memory cell 10 is off, i.e. before programming operation commences, the bit line 16 or the drain 16 is applied with a voltage Vbl sufficient to turn off the control gate 14, i.e. no current would flow from the source 12 to the drain 16. This voltage Vbl is maintained on the bit line 16 even during the rise time of Vsp, and is sufficient to turn off the flow of channel current from the source 12 to the drain 16. Thus, Vbl is of a magnitude such that it is greater than the difference between Vgp and the threshold voltage of the control gate 14. Immediately or shortly after Vsl reaches the programming voltage Vsp on the source 12, the voltage Vbl on the drain is reduced to a level Vdp that causes current to flow from the source 12 to the drain 16. Therefore, as shown in FIG. 4, by keeping the voltage Vbl on the bit line 16 until after the voltage has risen to Vsp on the source 12, and then Vbl is dropped to Vdp, that programming commences. This further reduces the programming efficiency degradation caused by the generation of hole displacement current Idis. To further reduce the displacement current Idis effect on programming efficiency degradation during the fall period when Vsp is reduced to Vdd, the voltage on the drain 16 is increased to Vbl level before the reduction of the voltage on the source 12.

Figure 5:
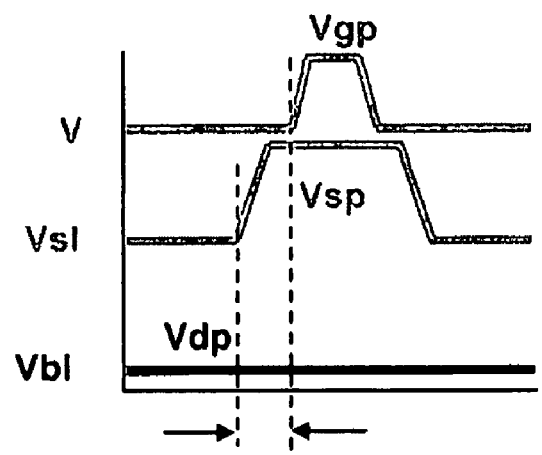
FIG. 5 is a timing diagram of yet another method of the present invention to reduce the programming efficiency degradation caused by the displacement current from the high voltage terminal.

Alternatively to keep the transistor 10 turned off while the programming voltage ramps up as it is applied to the source 12, is to keep the voltage Vgp on the control gate 14 at a level that is below its threshold voltage to inhibit programming until the programming voltage has reached Vsp, and then change the voltage applied to the control gate 14 to turn on the transistor 10. This is shown in FIG. 5.

From the foregoing it can be seen that a novel improved algorithm to increase the PAD Window is disclosed. This method also has the benefit of decreasing program disturbance on neighboring cells in an array of floating gate non-volatile memory cells.

What is claimed is:

1. A method of programming a floating gate transistor having a first region and a second region in a semiconductor substrate with a channel region between the first region and the second region, a floating gate spaced apart from the channel region for controlling the flow of current therein, wherein said floating gate is programmed by either channel hot electron injection or by source side injection, wherein said method comprising:

applying a first voltage to said first region, wherein said first voltage is characterized by a rise period, a programming period, and a fall period; and turning off the flow of channel current from said first region to said second region during said rise period.

2. The method of claim 1 wherein during said rise period, said first voltage is increased from a starting voltage to a programming voltage, said turning off comprises:

applying a second voltage to said second region, wherein said second voltage is of a first magnitude sufficient to turn off the flow of channel current from said first region during said rise period.

3. The method of claim 2 further comprising:

decreasing said first magnitude to a second magnitude wherein said second magnitude is sufficient to cause a current to flow from said first region to said second region.

4. The method of claim 1 further comprising turning off the flow of channel current from said first region to said second region during said fall period.

5. The method of claim 4 wherein during said fall period said first voltage is decreased from the programming voltage to an ending voltage, wherein said turning off comprises:

applying a second voltage to said second region, wherein said second voltage is of a second magnitude sufficient to turn off the flow of channel current from the first region during said fall period.

6. The method of claim 1 wherein said floating gate storage transistor is of a split gate type wherein said floating gate is positioned for controlling the flow of current over a first portion of the channel region, and a control gate laterally spaced apart from the floating gate and insulated from the channel region for controlling the flow of current over a second portion of the channel region, wherein said turning off comprises:

applying a second voltage to said control gate to turn off the flow of channel current from said first region to said second region during said rise period.

7. The method of claim 6 wherein said method further comprises:

applying a third voltage to said control gate to turn off the flow of channel current from said first region to said second region during said fall period.

8. The method of claim 1 wherein said floating gate storage transistor is of a stacked gate type and has a control gate capacitively coupled to the floating gate for controlling the flow of current over the channel region, wherein said turning off comprises:

applying a second voltage to said control gate to turn off the flow of channel current from said first region to said second region during said rise period.

9. The method of claim 8 wherein said method further comprises:

applying a third voltage to said control gate to turn off the flow of channel current from said first region to said second region during said fall period.

* * * * *